United States Patent
Johnson et al.

(10) Patent No.: US 7,801,501 B2
(45) Date of Patent: *Sep. 21, 2010

(54) METHOD FOR PERFORMING A FREQUENCY CORRECTION OF A WIRELESS DEVICE

(75) Inventors: Kenneth Johnson, Renton, WA (US); John Brown, Lynnwood, WA (US); Edward Vertatschitsch, Bellevue, WA (US)

(73) Assignee: Palm, Inc., Sunnyvale, CA (US)

( * ) Notice: Subject to any disclaimer, the term of this patent is extended or adjusted under 35 U.S.C. 154(b) by 66 days.

This patent is subject to a terminal disclaimer.

(21) Appl. No.: 11/891,376

(22) Filed: Aug. 10, 2007

(65) Prior Publication Data
US 2008/0039026 A1 Feb. 14, 2008

Related U.S. Application Data

(63) Continuation of application No. 11/115,784, filed on Apr. 27, 2005, now Pat. No. 7,272,369, which is a continuation of application No. 09/844,955, filed on Apr. 26, 2001, now Pat. No. 6,907,233.

(51) Int. Cl.
*H04B 1/18* (2006.01)
(52) U.S. Cl. .................. 455/192.2; 455/71; 455/260; 375/355
(58) Field of Classification Search .......... 455/68, 455/70, 71, 75, 76, 192.1, 192.2, 255–260; 375/327, 344, 346, 357, 371, 373, 375
See application file for complete search history.

(56) References Cited

U.S. PATENT DOCUMENTS

| 5,233,632 | A | * | 8/1993 | Baum et al. | ................. 375/344 |
| 5,740,525 | A | * | 4/1998 | Spears | ........................ 455/259 |
| 5,809,088 | A | * | 9/1998 | Han | ............................ 375/344 |
| 5,905,405 | A | * | 5/1999 | Ishizawa | ..................... 329/308 |
| 6,907,233 | B1 | * | 6/2005 | Johnson et al. | .......... 455/192.2 |
| 7,272,369 | B1 | * | 9/2007 | Johnson et al. | .......... 455/192.2 |

* cited by examiner

*Primary Examiner*—Nhan Le

(57) ABSTRACT

A method of performing a frequency correction of a radio module. Multiple samples of frequency data during a quiescent portion of the base station transmission is taken to estimate the amount of frequency correction needed. An embodiment applies the frequency data to a median filter to eliminate invalid data. Next, a new reference frequency is applied to a radio transceiver in the radio module to provide the frequency correction. If the frequency was corrected by greater than a pre-determined amount, the process performs a large shift frequency correction, including verifying that the first frequency correction was satisfactory and verifying that the radio transceiver is able to receive data after the frequency correction has been performed. If the frequency was corrected by smaller than a pre-determined amount, the process performs a small shift frequency correction, including updating a total of all frequency corrections made since a stored reference frequency was updated.

47 Claims, 8 Drawing Sheets

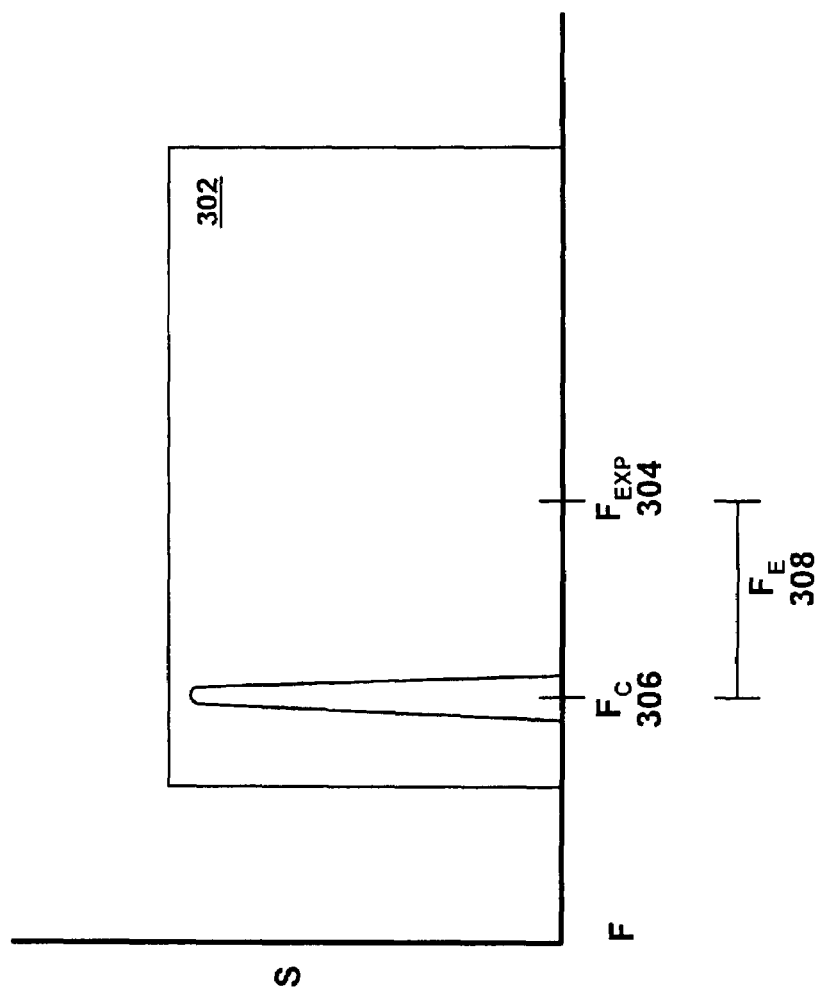

METHOD FOR PERFORMING A FREQUENCY CORRECTION OF A WIRELESS DEVICE

RELATED U.S. PATENT APPLICATION

This Continuation Application claims the benefit and priority to the, commonly-owned U.S. patent application Ser. No. 11/115,784, filed on Apr. 27, 2005 now U.S. Pat. No. 7,272,369, by Valenzuela et al., and entitled "METHOD FOR PERFORMING A FREQUENCY CORRECTION OF A WIRELESS DEVICE," which is a Continuation Application claiming the benefit and priority to commonly-owned U.S. patent application Ser. No. 09/844,955, filed on Apr. 26, 2001, now issued as a U.S. Pat. No. 6,907,233 by Valenzuela et al., and entitled "METHOD FOR PERFORMING A FREQUENCY CORRECTION OF A WIRELESS DEVICE," which are incorporated herein by reference.

FIELD OF THE INVENTION

The present invention relates to the field of wireless communication. Specifically, the present invention relates to a method for performing a frequency correction in a wireless device to compensate for changes in the frequency output by an oscillator.

BACKGROUND ART

As is well known, conventional radios use a crystal oscillator for tuning. It is conventional to store a reference frequency, which is used to assist in accurate tuning of the radio. When the radio is manufactured, the device is tested to determine an appropriate reference frequency to use such that the radio will tune properly given the actual frequency which the oscillator outputs. The actual oscillator signal is input to the radio transceiver, along with the reference frequency, to produce a frequency to accurately tune the radio. In this fashion, data may be received reliably.

However, the frequency which the crystal oscillator outputs may change over time. For example, significant changes may occur to physical characteristics of the oscillator early in the life of the radio device. Consequently, if a user should first turn on the device, for example, several months after it was manufactured, the device may be unable to properly receive data. The crystal oscillator is also sensitive to temperature variations, and hence a radio may have trouble tuning and receiving data if the ambient temperature changes.

Some conventional methods for performing frequency corrections make an estimate of how much frequency correction needs to be applied to compensate for changes to the crystal oscillator. For example, frequency offset samples are taken to estimate the needed frequency correction. However, some methods will only make frequency corrections if the needed correction is large, for example, greater than 400 Hz. This is because of an inherent unreliability of the process of determining the needed correction. Were these methods to make a frequency correction for smaller needed changes, the probability that the radio performance will actually decrease is significant.

Some conventional methods of performing a frequency correction of a radio require that very stringent acceptance criteria be met for each of a number of frequency offset samples (needed frequency corrections). If the criteria are not met for any of the samples, the process starts over. Consequently, while this may help with the accuracy of the frequency correction estimates, it is not efficient. The narrow band of acceptance criteria may comprise requiring that the radio receives: a certain number of channels correctly; a certain number of packets from the channel; and a signal at a minimum strength. Furthermore, the temperature must be in a certain range and the frequency offset (needed correction) must be at least, for example, 400 Hz.

All methods of providing frequency correction should deal with several problems that may cause inaccurate data sampling. For example, noise can interfere with the sampling or the signal itself may be weak. Other causes of invalid frequency sampling data may include other devices operating at the same time, which may cause a false frequency shift. Or, the carrier signal may be floating because the base station has just finished transmitting data. Some conventional methods take several samples over a long period of time to address these problems. Unfortunately, because the sampling and processing take a long time, the ability of the radio to process further data (e.g., accept incoming packets) is hindered.

Consequently, from an end user standpoint, many conventional methods are too time consuming and result in less accurate and too infrequent frequency corrections.

SUMMARY OF THE INVENTION

Therefore, it would be advantageous to provide a method to perform a frequency correction to account for changes to the physical characteristics of an oscillator. A further need exists for a method which efficiently and accurately corrects frequency while minimally interfering with the data transmission. A further need exists for a method which is able to correct frequency for devices which have not been used for some time, especially those which are being used for the first time and may be subject to large frequency errors. A still further need exists for a method which has a very low chance of producing an erroneous frequency correction and leaving the user with an inoperative device.

The present invention provides a method to perform a frequency correction to account for changes to the physical characteristics of an oscillator. Embodiments provide for a method which efficiently and accurately corrects frequency while minimally interfering with the data transmission. Embodiments provide for a method which is able to correct frequency for devices which have not been used for some time. Embodiments have a very low chance of producing an erroneous frequency correction, and hence will not leave the user with an inoperative device.

A method of performing a frequency correction of a radio module is disclosed. The method first samples frequency data to estimate the needed frequency correction. The sampling may comprise a plurality of samples taken during a quiescent portion of the base station transmission. An embodiment applies the frequency data to a median filter to substantially eliminate invalid data. Next, a new reference frequency is applied to a radio transceiver in the radio module to provide the frequency correction. If the frequency was corrected by greater than a pre-determined amount, the process performs the following series of steps. The process samples frequency data a second time to estimate the amount of frequency correction now needed. Then, the process determines if the first frequency correction was satisfactory by determining if the needed second frequency correction is less than a pre-determined amount. If the first frequency correction was unsatisfactory, the original frequency is restored in a digital signal processor of the radio module, which sends the original frequency to the radio transceiver.

If, however, the first frequency correction was satisfactory, a reference frequency is applied to the radio transceiver to compensate for the first and second estimated frequency errors. Next, the process verifies that the radio transceiver is able to receive data after the frequency correction has been performed. If the radio transceiver is able to validly receive data, then the reference frequency is updated in non-volatile memory to reflect the frequency corrections made. If not, the original reference frequency is restored in the radio module.

If the original estimate of the needed frequency correction revealed a needed correction of less than a pre-determined amount, then the process updates a net total of all changes made since the last time a reference frequency stored in memory was updated. If this net total is greater than a pre-determined amount, the process stores in non-volatile memory a new reference frequency based on the net total and the previous reference frequency.

The present invention provides these advantages and others not specifically mentioned above but described in the sections to follow.

BRIEF DESCRIPTION OF THE DRAWINGS

FIG. 3 is a graph illustrating the energy of the sampled frequency data versus frequency, according to an embodiment of the present invention.

DETAILED DESCRIPTION OF THE INVENTION

In the following detailed description of the present invention, a method for providing a frequency correction of a wireless device, numerous specific details are set forth in order to provide a thorough understanding of the present invention. However, it will be recognized by one skilled in the art that the present invention may be practiced without these specific details or with equivalents thereof. In other instances, well known methods, procedures, components, and circuits have not been described in detail as not to unnecessarily obscure aspects of the present invention.

Notation and Nomenclature

Some portions of the detailed descriptions which follow are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "indexing" or "processing" or "computing" or "translating" or "calculating" or "determining" or "scrolling" or "displaying" or "recognizing" or "generating" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Method for Performing a Frequency Correction of a Wireless Device

Figure 1:
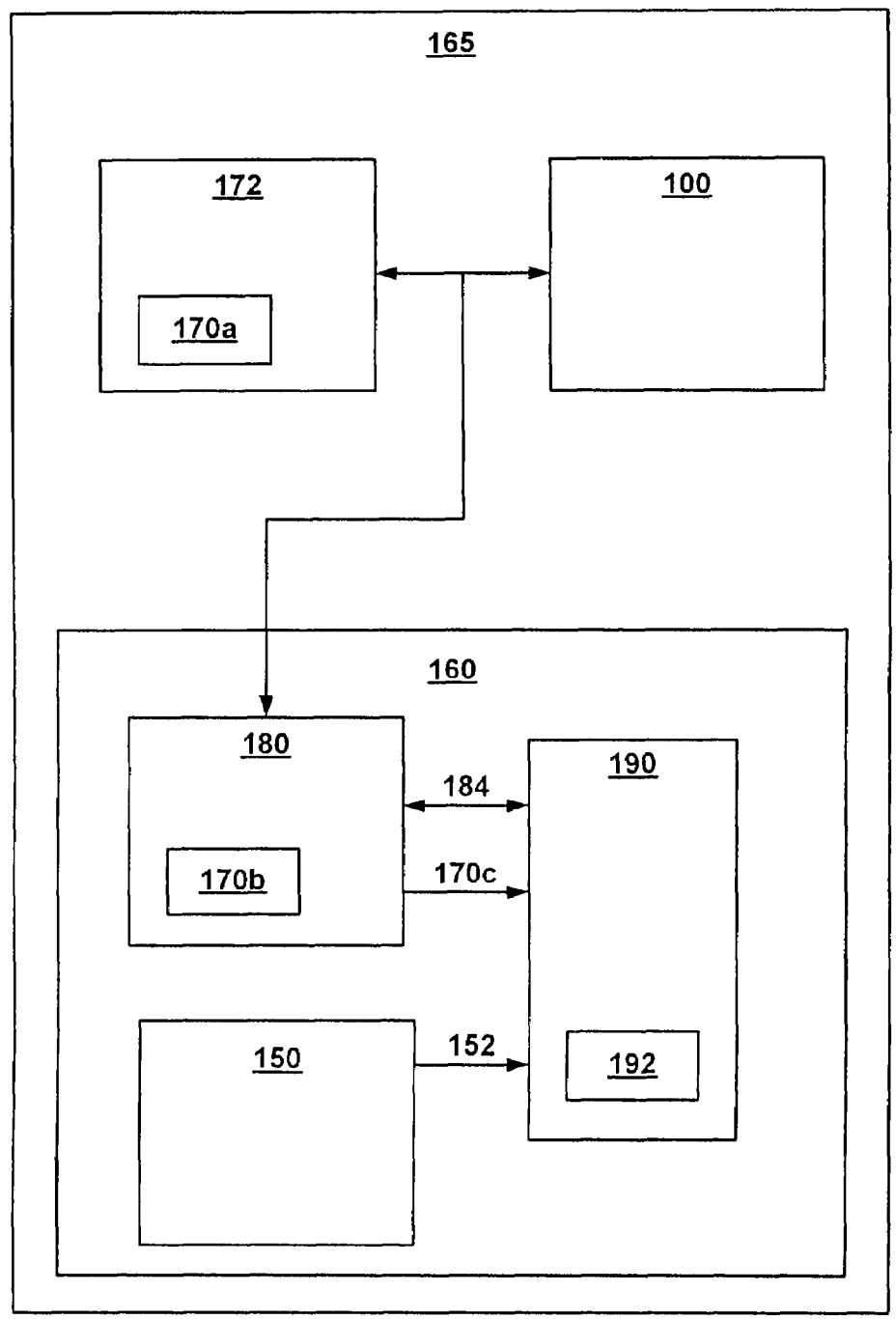
FIG. 1 is a schematic diagram illustrating a reference frequency being applied to a processor to produce a frequency for tuning a radio module, in accordance with embodiments of the present invention.

Referring now to FIG. 1, the oscillator 150 in a radio module 160 of a communications device 165 outputs a frequency 152, which is input to the radio transceiver 190. A reference frequency 170 is stored in non-volatile memory 172 (e.g., flash). The digital signal processor 180 (DSP) sends the reference frequency 170 to the radio transceiver 190. The DSP 180 and the radio transceiver 190 are coupled by a two-way communication link 184. The reference frequency 170 is used by the radio transceiver 190 in conjunction with frequency 152 to produce a carrier wave frequency 192 for tuning the radio. When the device is manufactured, the carrier wave frequency 192 is calibrated by setting the reference frequency 170 depending on the frequency 152 that the oscillator 150 outputs. However, the frequency 152 that the oscillator 150 outputs varies over time. Therefore, embodiments of the present invention determine a suitable new reference frequency 170 and transfer it to either the DSP 180 or the non-volatile memory 172. A general purpose computer 100, such as the one in FIG. 4 may be used to determine the new reference frequency 170. Alternatively, the algorithm may be run entirely within the DSP 180. It will be understood that the reference frequency 170 may not be a value that equals a frequency but that it may be a value that is used by the DSP 180 in conjunction with the radio transceiver 190 to compensate for changes in the frequency 152 output by the oscillator 150. For example, to re-tune the carrier wave frequency 192 the radio transceiver 190 typically accepts frequency offset adjustments, as is well understood by those of ordinary skill in the art. In this fashion, the carrier wave frequency 192 used by the radio transceiver 190 is adjusted to compensate for changes in the frequency 152 output by the oscillator 150.

Referring to FIG. 3, to estimate a frequency error 308, one embodiment samples frequency data over a 2 KHz window 302 for a pre-determined time interval. FIG. 3 shows a graph 300 of the energy of the received signal (S) versus frequency (f). In the preferred embodiment, the sampling is done during a quiescent period in base station transmission, for example, when a carrier frequency is being transmitted, but no data. The window 302 may be centered where the radio expects the carrier frequency (e.g., $f_{exp}$ 304) transmitted by a remote base station to be. In one embodiment, the duration of the sampling time interval is 2 ms. Preferably the sampling interval is relatively short, for example 2 ms to 32 ms. In this fashion, the sampling has minimal interference with data communication. However, the present invention may sample for longer intervals of 1 second or more. Furthermore, the width of the sampling window 302 may be other than 2 KHz.

Still referring to FIG. 3, if there is no frequency error 308, the frequency data will have a spike where the carrier frequency is expected to be (e.g., $f_{exp}$ 304). However, if the device needs frequency correction, there will be an offset between the carrier frequency 306 (e.g., $f_c$) and the expected frequency 304. This difference is the frequency error 308 (e.g., $f_e$).

In another embodiment, the sampling does not occur during the quiescent period. Rather, the frequency sampling is done while data packets are being transmitted by the base station. Over an extended period of time the data is expected to have a substantially equal number of zeros and ones; therefore, if sampled over a sufficient period of time, accurate frequency data may be obtained. However, it is preferred to sample during the quiescent period because a shorter sampling period may be used and there is no inaccuracy introduced by an inequality between the number of zeroes and ones.

Figure 2A:
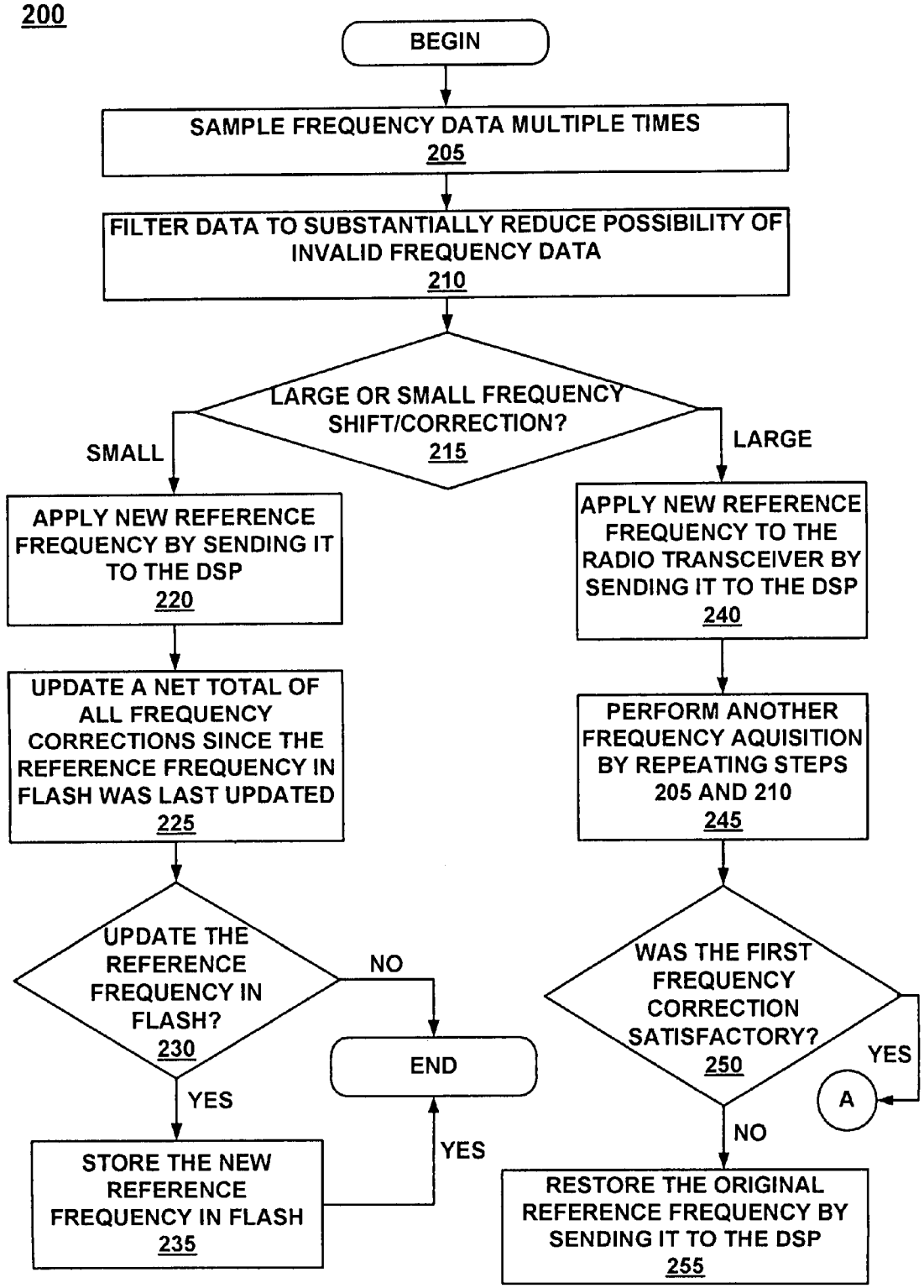
FIG. 2A and FIG. 2B are flowcharts illustrating the steps of a process of performing a frequency correction of a wireless device, in accordance with embodiments of the present invention.

Referring now to FIG. 2A, an embodiment of the present invention provides for a process 200 of performing a frequency correction. This process 200 may be applied, for example, whenever the device is first turned on, when it has been turned off for a significant period of time, or when the device is tuned to a new base station. Alternatively, process 200 may be executed every few hours or even every few minutes. The frequency correction compensates for errors in the ability of the device to receive wirelessly communicated data properly. In step 205, the process 200 samples frequency data multiple times. The present invention is well suited to a variety of sampling techniques, such as, for example, estimating the frequency error through Fourier Analysis, a digital discriminator technique, etc.

In step 210, the process 200 filters the sampled frequency data with, for example, a median filter. In this fashion, the median frequency error is used to perform the frequency correction. This substantially reduces the possibility of using an invalid frequency sample. In the preferred embodiment, the frequency data is sampled three times. However, the present invention is well suited to more or less samples. Sampling only once may be done; however, because noise can interfere with the sampling, multiple sampling is preferred. Sampling more times may reduce the chance of invalid data, but is less efficient. Furthermore, the data may be filtered in other ways, such as a statistical mean, etc.

After the data is filtered, the process 200 determines if the frequency error (shift) 308 is relatively large or small, in step 215. For example, the frequency error 308 may be compared to a pre-determined value. In the preferred embodiment this is 250 Hz. In other embodiments, this value ranges from 125 to 800 Hz; however, the present invention is suited to a higher or lower frequency for the value which defines a large frequency error.

If the frequency error 308 is small, then in step 220 a new reference frequency 170 is applied by sending it the DSP 180 of the radio module 160, which sends it on to the radio transceiver 190. Alternatively, the DSP 180 may generate the new reference frequency itself. In the preferred embodiment, the reference frequency 170 that is stored in the non-volatile memory 172 is not yet updated. However, the non-volatile memory 172 may be updated. Preferably, no check is made to see if the frequency correction is valid, as a shift of 250 Hz should not substantially impair the ability of the radio module 160 to receive packet data. In the unlikely case that the frequency correction is in error, it will be corrected the next time this algorithm executes, which will occur if the signal is lost.

Next, in step 225, the process 200 updates a net total of all the frequency corrections made since the last time the reference frequency 170a stored in non-volatile memory 172 was updated. As the process 200 preferably always updates the stored reference frequency 170a for large frequency corrections, in general this net total is only of small frequency corrections. However, an alternative embodiment may also keep track of large frequency corrections that are not stored in non-volatile memory 172.

Next, in step 230, the process 200 determines if the stored reference frequency 170a should be updated. In the preferred embodiment, this is done if the net total is greater than 125 Hz. In other embodiments, the stored reference frequency 170a is updated when the net total reaches a pre-determined value up to, for example, 300 Hz or down to, for example, 30 Hz.

In step 235, the stored reference frequency 170a is updated. Then, the process 200 ends as the frequency correction for a small frequency shift has been successfully completed.

If step 215 determined that the frequency error 308 was large, then step 240 is taken. In step 240, a new reference frequency 170 is applied to the radio transceiver 190 by, for example, sending it the DSP 180.

Next, in step 245, the process 200 performs another frequency acquisition to determine the effect of applying the new reference frequency 170b. The process 200 executes actions such as described in connection with step 205 and 210 again. In this fashion, a second frequency error 308 is determined.

Next, in step 250, the process 200 determines if the first frequency correction was satisfactory (e.g., was within pre-determined parameters). This is accomplished, in the preferred embodiment, by verifying that the second frequency error is less than 125 Hz. Other embodiments use a value between 31 and 250 Hz. However, values outside of this range may be used.

If the second frequency error is greater than 125 Hz, then the original reference frequency 170 is restored in the DSP 180 and applied to the radio transceiver, in step 255. In this case, the first frequency correction is deemed invalid. To this point, the value stored in non-volatile memory 172 has not been affected. The process 200 may then return to step 205, to start the frequency correction process over. Other embodiments, discussed herein take further steps in that case, however.

However, if the second frequency error is less than 125 Hz, the first frequency correction is deemed valid, in which case a second reference frequency 170 is sent to the DSP 180, in step 260, which sends it on to the radio transceiver 190. The second reference frequency accounts for the frequency error 308 found in both the first and second frequency data acquisitions of step 205 and step 245.

Next, in step 265, the process 200 determines if the radio transceiver 190 validly receives packet data. In the case where the Mobitex Interface Specification is used, this may be defined as being able to receive Mobitex Data Block packets with no CRC errors or Mobitex Frame Head Packets with no errors. The number of acceptable errors for frame head packets may be one or two, in other embodiments. In cases in which other interface specifications are used, similar packet quality checks which are appropriate for those standards may be made. Alternatively, this check may be made by evaluating quality metrics which are issued by the DSP 180. This step may determine whether the quality metrics have improved as a result of the second frequency correction. The level of improvements necessary for a passing grade may be defined as that which is necessary to achieve a minimum desired data communication reliability and may be altered to suit circumstances.

If the packet data is valid, then a new reference frequency 170a is stored in non-volatile memory 172, in step 270. In this fashion, the DSP 180 may access the stored value 170a. The process 200 then ends, as the frequency correction for a large shift frequency error 308 has been successful.

If the packet data is not valid, then the original reference frequency 170 is restored by sending it to the DSP 180 and then on to the radio transceiver 190, in step 275. Note that the non-volatile memory 172 was not updated along this path. However, in embodiments which do store a new reference frequency 170 in non-volatile memory 172 along this path, the original value in memory 172 will be restored. The process 200 may then return to step 205 restart the frequency correction procedure.

Figure 2B:
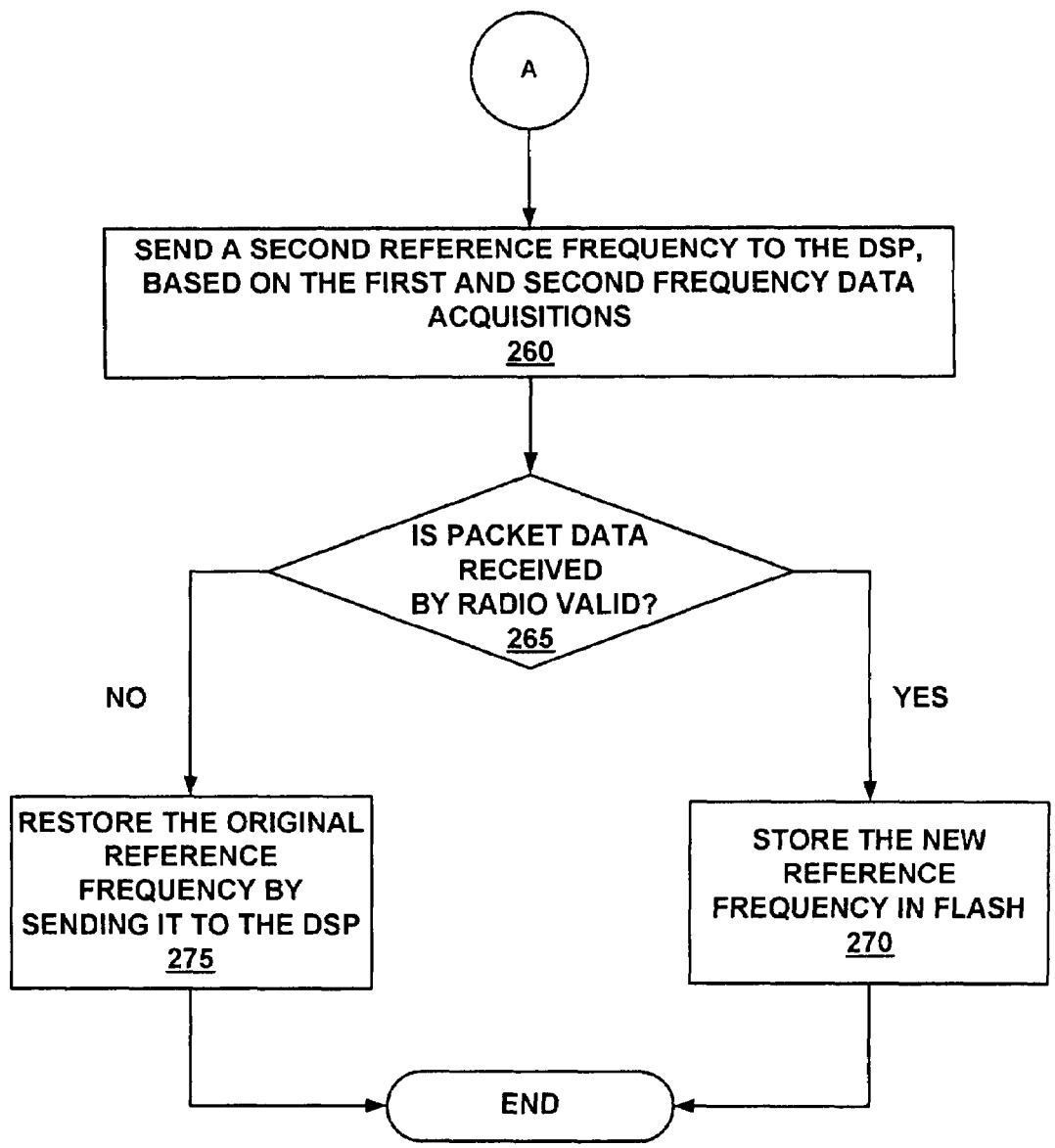
Figure 2C:
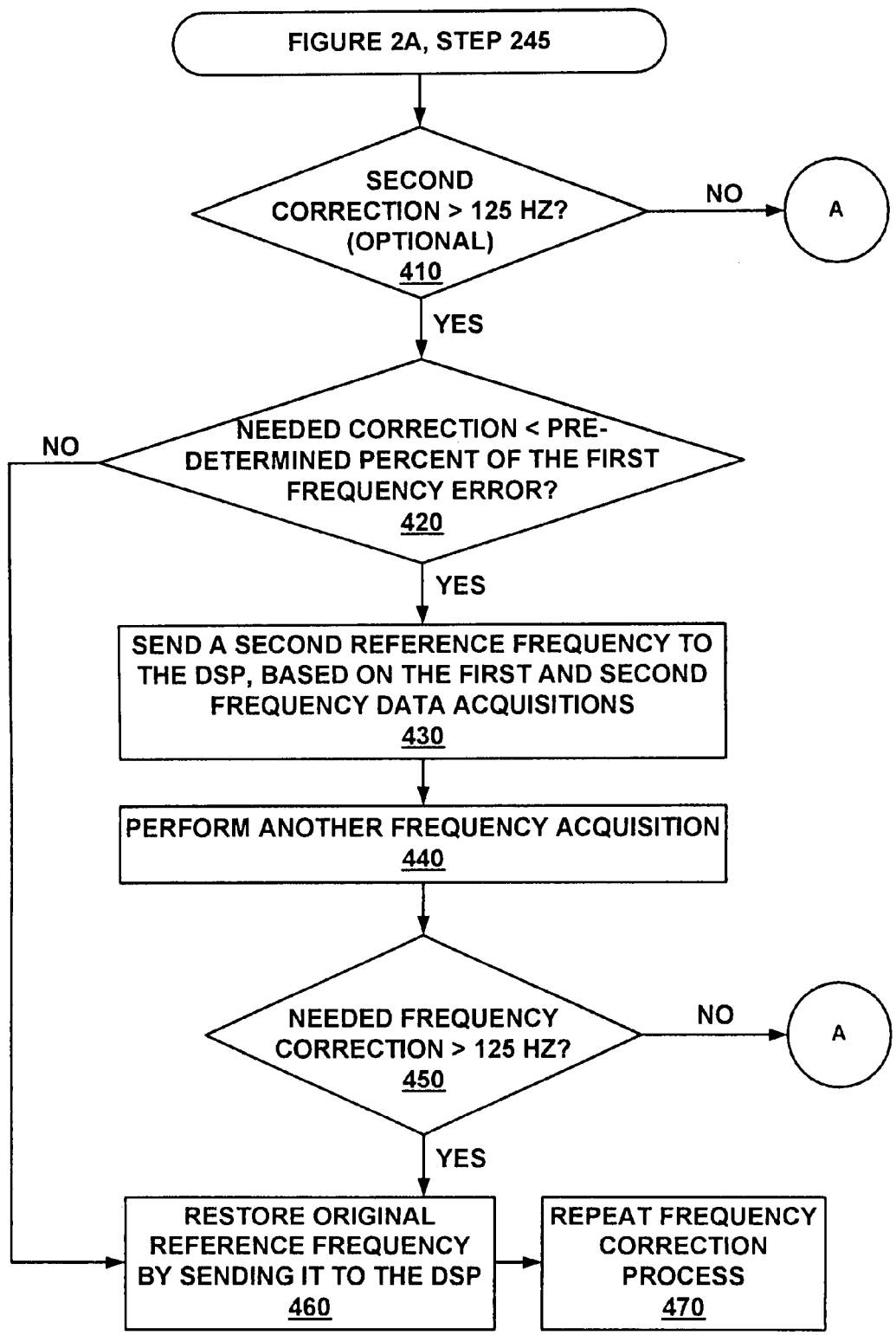
FIG. 2C, FIG. 2D, and FIG. 2E are flowcharts illustrating the steps of three alternative embodiments of processes of performing a frequency correction of a wireless device, in accordance with embodiments of the present invention.

FIG. 2C illustrates the steps of a frequency correction algorithm, according to an alternative embodiment to that of the process 200 in FIG. 2A and FIG. 2B. The process of FIG. 2C replaces some of the steps of the process 200 in FIG. 2A and FIG. 2B. The steps of this embodiment are best suited to cover cases in which the initial frequency error 308 was relatively large. This may occur, for example, if the device 165 is first being used a significant time after manufacture. The process begins after step 245 of FIG. 2A in which a second frequency acquisition was performed after a first frequency correction was applied. In step 410, this embodiment determines if the frequency error 308 is greater than a pre-determined value (e.g., 125 Hz). If it is not, then the first frequency correction was satisfactory and the process goes to "A" (e.g., the steps of FIG. 2B are executed) to complete the frequency correction.

If the frequency error 308 is greater than 125 Hz, then step 420 is taken in which the relative size of the frequency error 308 is checked. For example, this embodiment determines if the needed correction is less than a pre-determined percent of the first frequency correction. Any suitable percent may be used.

If the second frequency error 308 is greater than the pre-determined percent of the first frequency error 308, then the original reference frequency 170 is restored by sending it to the DSP 180 and on to the radio transceiver 190, in step 460.

Otherwise, in step 430, a reference frequency 170 that accounts for both the first and second frequency errors 308 is sent to the DSP 180 and on to the radio transceiver 190.

In step 440, another frequency acquisition is done by sampling and filtering the frequency data, as described in connection with steps 205 and 210 of FIG. 2A.

Next, in step 450, this embodiment determines if the previous frequency correction was satisfactory. For example, the process may test for whether the newest frequency error 308 is less than a predetermined value. Alternatively, a step such as 420 may be executed, in which the newest frequency error 308 is compared with a percent of a previous frequency error 308. Furthermore, both the absolute size and percent may be checked, as in steps 410 and 420.

If step 450 determined that the previous frequency correction was satisfactory, then this embodiment executes the steps at "A" of FIG. 2B, to complete the frequency correction.

If, however, step 450 determined that the previous frequency correction was unsatisfactory, then the original reference frequency 170 is restored by sending it to the DSP 180 and on to the radio transceiver 190, in step 460. Then, step 470 is executed, in which the entire frequency correction process is repeated by, for example, performing the process 200 of FIG. 2A, with the option of using the algorithm of FIG. 2C after step 245.

Figure 2D:
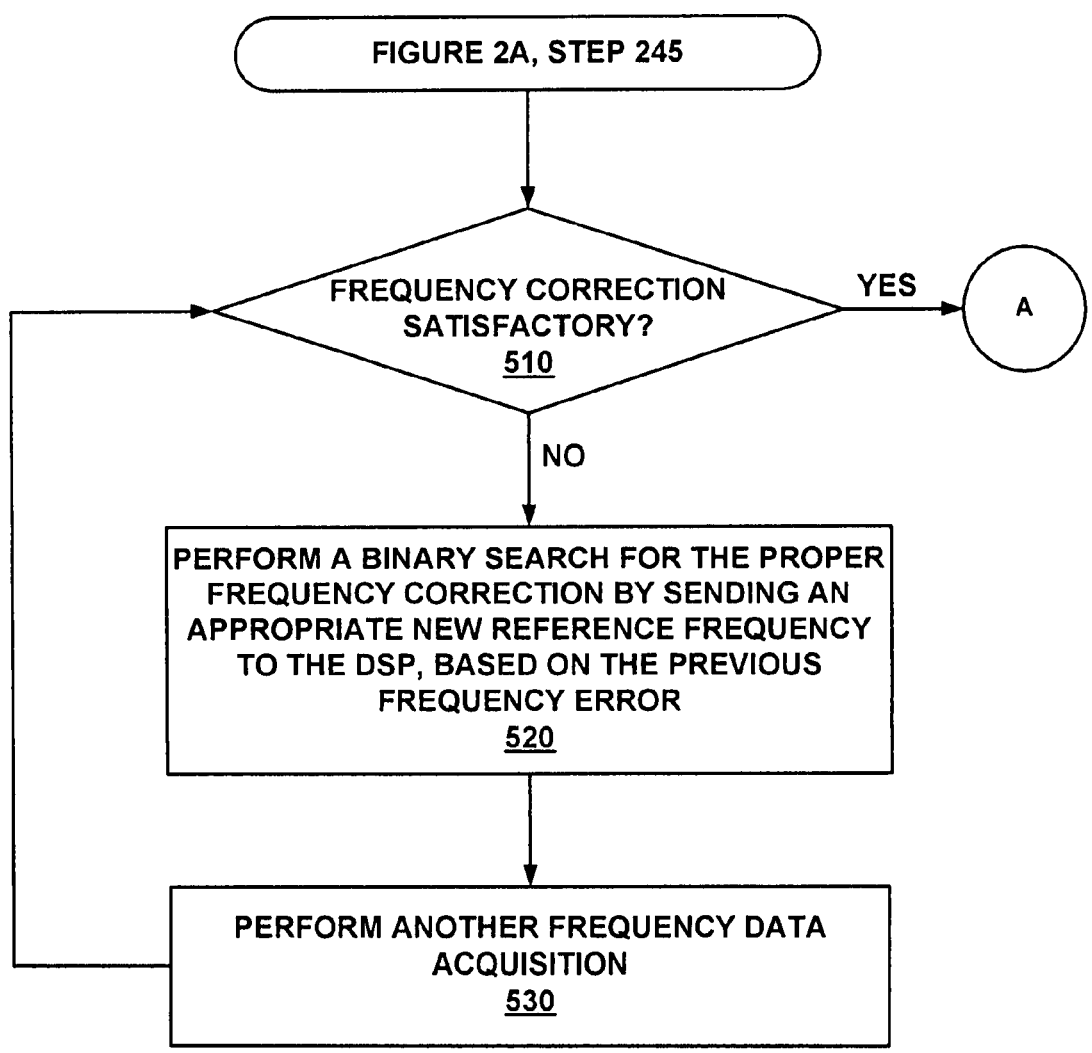

Referring now to FIG. 2D, still another alternative embodiment of a frequency correction process will be discussed. This embodiment may also start after step 245 of FIG. 2A. In step 510, this embodiment determines if the previous frequency correction was satisfactory. This may be done by comparing the frequency error 308 with a pre-determined value or percent of a previous frequency error 308, as discussed herein.

If the previous frequency correction was satisfactory, then path "A" is taken to complete the frequency correction process. Path "A" may execute the steps of FIG. 2B.

If the previous frequency correction was unsatisfactory, then a binary search is performed to locate a satisfactory frequency correction, in step 520. For example, if the first frequency error was 1000 Hz, then the next frequency correction may be 500 Hz, etc. A new reference frequency 170 is sent to the DSP 180 to effectuate the update of the frequency 170 used by the radio transceiver 190 for tuning.

Next, in step 530, this embodiment performs another frequency data acquisition to determine the effect of the update. Then this embodiment returns to step 510, to again determine if the frequency correction was satisfactory. The process loops until a satisfactory frequency correction is found and path "A" is taken. If an excessive number of steps are taken, this embodiment may exit, restore the original reference frequency, and start over.

Figure 2E:
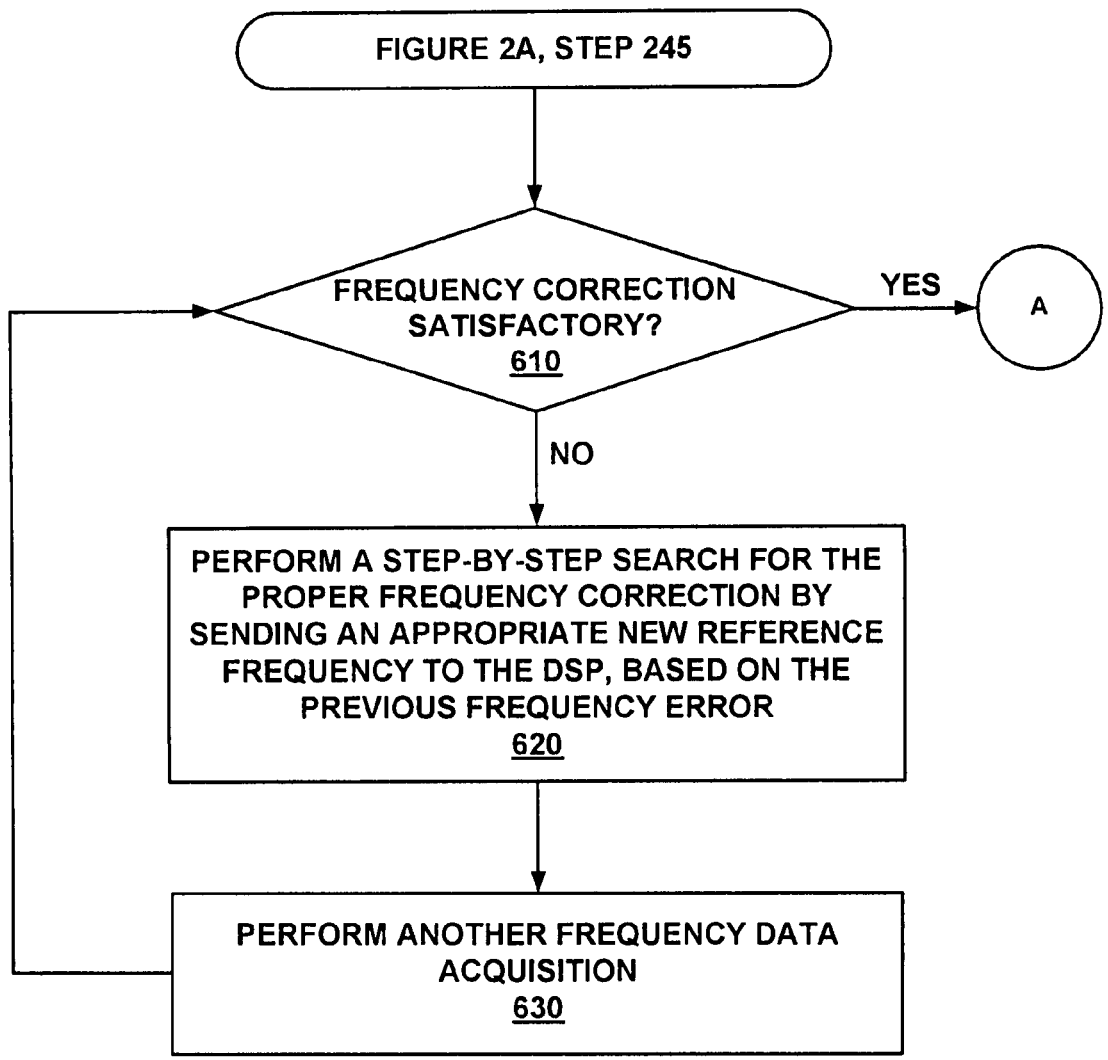

Referring now to FIG. 2E, still another alternative embodiment of a frequency correction process will be discussed. This embodiment may also start after step 245 of FIG. 2A. In step 610, this embodiment determines if the previous frequency correction was satisfactory. This may be done by comparing the frequency error 308 with a pre-determined value or percent of a previous frequency error 308, as discussed herein.

If the previous frequency correction was satisfactory, then path "A" is taken to complete the frequency correction process. Path "A" may execute the steps of FIG. 2B.

If the previous frequency correction was unsatisfactory, then a step-by-step search is performed to locate a satisfactory frequency correction, in step 620. For example, the step size may be the minimum step which would not lead to a loss of performance of the radio. However, other step sizes may be used. A new reference frequency 170 is sent to the DSP 180 to effectuate the update.

Next, in step 630, this embodiment performs another frequency data acquisition to determine the effect of the update. Then, this embodiment re-returns to step 610, to again determine if the frequency correction was satisfactory. The process loops until a satisfactory frequency correction found and path "A" is taken. If an excessive number of steps are taken, this embodiment may exit, restore the original reference frequency 170, and start over.

It will be understood that the various embodiments discussed in connection with FIG. 2A through FIG. 2E may be used together. For example, an embodiment may adaptively switch from one technique for frequency correction to another.

Figure 4:
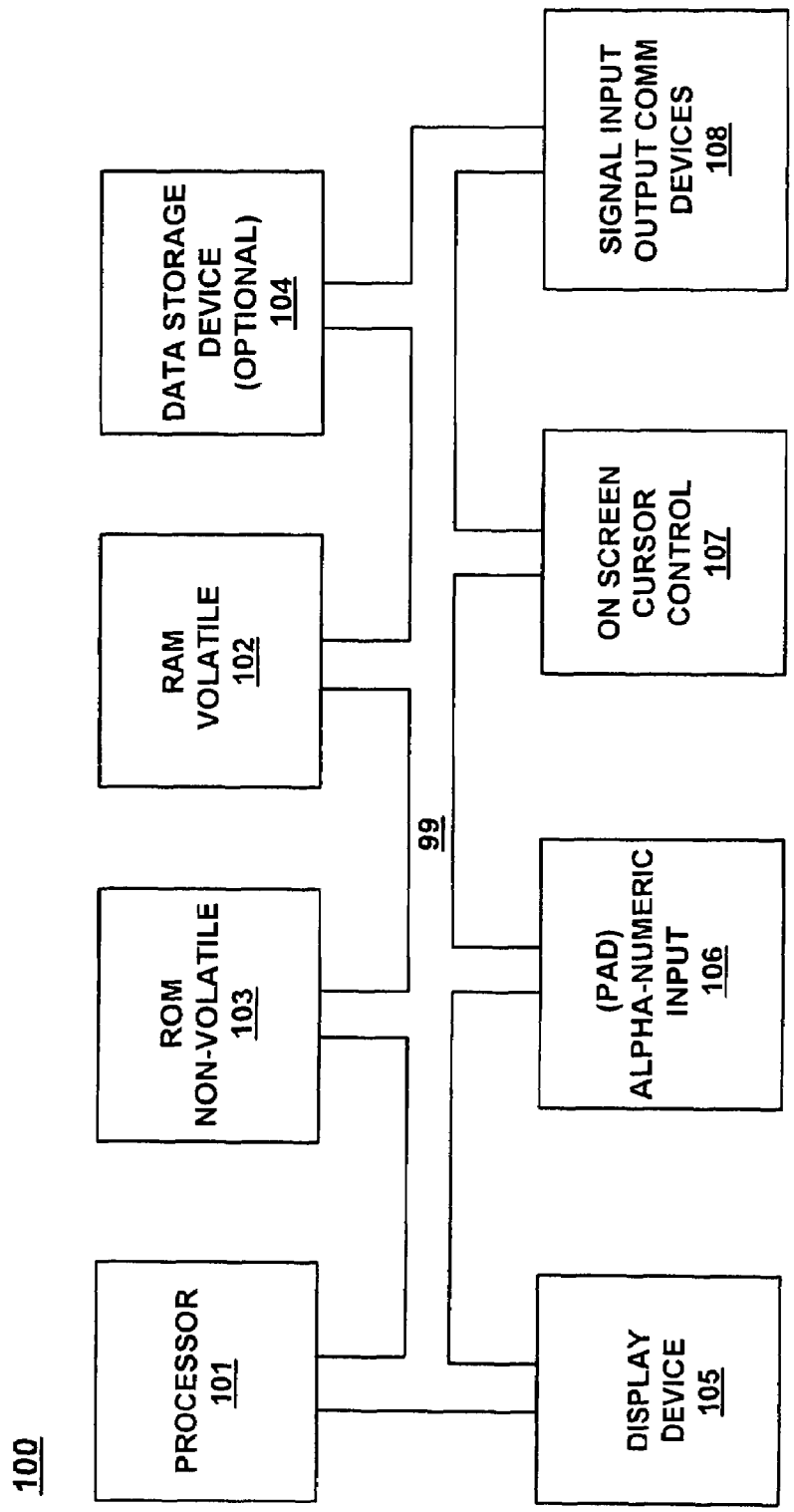
FIG. 4 is a schematic of a computer system, which may be used to implement embodiments of the present invention.

FIG. 4 illustrates circuitry of computer system 100, which may form a platform for the DSP 180 or other components. Computer system 100 includes an address/data bus 99 for communicating information, a central processor 101 coupled with the bus for processing information and instructions, a volatile memory 102 (e.g., random access memory RAM) coupled with the bus 99 for storing information and instructions for the central processor 101 and a non-volatile memory 103 (e.g., read only memory ROM) coupled with the bus 99 for storing static information and instructions for the processor 101. Computer system 100 also includes an optional data storage device 104 (e.g., a magnetic or optical disk and disk drive) coupled with the bus 99 for storing information and instructions.

With reference still to FIG. 4, system 100 of the present invention also includes an optional alphanumeric input device 106 including alphanumeric and function keys is coupled to bus 99 for communicating information and command selections to central processor unit 101. System 100 also optionally includes a cursor control device 107 coupled to bus 99 for communicating user input information and command selections to central processor unit 101. System 100 of the present embodiment also includes an optional display device 105 coupled to bus 99 for displaying information. A signal input/output communication device 108 coupled to bus 99 provides communication with external devices.

The preferred embodiment of the present invention a method for performing a frequency correction is thus described. While the present invention has been described in particular embodiments, it should be appreciated that the present invention should not be construed as limited by such embodiments, but rather construed according to the below claims.

What is claimed is:

1. A method of performing a frequency correction, said method comprising:
    determining a first estimated frequency error;
    applying a first frequency correction based on said first estimated frequency error;
    performing a large frequency correction when said first estimated frequency error is larger than a given threshold; and
    updating a net total of frequency errors from a last net total update in response to said first estimated frequency error being less than or equal to said first given threshold.

2. The method as described in claim 1 wherein said performing comprises:
    determining a second estimated frequency error; and
    applying a second frequency correction based on said second estimated frequency error when said second estimated frequency error is within a second given threshold.

3. The method as described in claim 2 further comprising:
    restoring an original frequency when said second frequency error is outside of said second given threshold.

4. The method as described in claim 2 further comprising:
    after said applying said second frequency correction, determining whether received data is valid;
    updating a reference frequency based on said first and said second estimated frequency errors when said received data is valid; and
    restoring an original reference frequency when said received data is invalid.

5. The method as described in claim 2 wherein said second given threshold is selected from a group consisting of a frequency value and a predetermined percentage of said first estimated frequency error.

6. The method as described in claim 1 further comprising:
    storing a new reference frequency based on said net total and a previously stored reference frequency when said net total is greater than a third pre-determined amount.

7. The method as described in claim 1 wherein said determining comprises:
    sampling frequency received data to collect sampled data; and
    applying a median filter to said sampled data.

8. The method as described in claim 7 wherein said sampling is performed during a quiescent period.

9. A method of performing a frequency correction, said method comprising:
    determining a first estimated frequency error based on an original reference frequency;
    performing a large frequency correction when said first estimated frequency error is outside of an acceptable threshold; and
    performing a small frequency correction when said first estimated frequency error is within said acceptable threshold, wherein said performing said small frequency correction comprises:
        changing said original reference frequency based on said first estimated frequency error to provide a changed original reference frequency;
        updating a net total of frequency errors; and
        storing said changed original reference frequency based on said net total and a previously stored reference frequencies when said net total is greater than a predetermined amount.

10. The method as described in claim 9 wherein said large frequency correction comprises:
    changing said original reference frequency based on said first estimated frequency error; and
    restoring said original reference frequency when said change has unsatisfactory results.

11. The method as described in claim 10, wherein determining said unsatisfactory results comprises:
    determining a second frequency error; and
    determining whether said second frequency error is satisfactory.

12. The method as described in claim 11, further comprising:
    determining whether received data is valid based on said changed original reference frequency;
    storing said changed original reference frequency when said received data is valid; and
    restoring said original reference frequency when said received data is invalid.

13. The method as described in claim 12 further comprising:
    in response to said restoring, performing a binary search for a suitable reference frequency.

14. The method as described in claim 12 further comprising:
    in response to said restoring, performing a search for a suitable reference frequency.

15. A communications device comprising:
    a tunable module operable to use a reference frequency; and
    logic operable to:
        determine a first estimated frequency error;
        apply a first frequency correction based on said first estimated frequency error;
        perform a large frequency correction when said first estimated frequency error is larger than a given threshold;
        determine a second estimated frequency error;
        apply a second frequency correction based on said second estimated error when said second estimated frequency error is within a second given threshold; and restore an original frequency when said second frequency error is outside of said second given threshold.

16. The communications device as described in claim 15 wherein said logic is further operable to:
after said applying said second frequency correction, determine whether received data is valid;
update a reference frequency based on said first and said second estimated frequency errors when said received data is valid; and
restore an original reference frequency when said received data is invalid.

17. The communications device as described in claim 15 wherein said second given threshold is selected from a group consisting of a frequency value and a predetermined percentage of said first estimated frequency error.

18. The communications device as described in claim 15 wherein said logic is further operable to:
update a net total of frequency errors from a last net total update responsive to said first estimated frequency error being less than or equal to said first given threshold.

19. The communications device as described in claim 18 wherein said logic is further operable to:
store a new reference frequency based on said net total and a previously stored reference frequency when said net total is greater than a third pre-determined amount.

20. The communications device as described in claim 15 wherein said determining a first estimated frequency error comprises:
sampling frequency received data to provide sampled data; and
applying a median filter to said sampled data.

21. The communications device as described in claim 20 wherein said sampling is performed during a quiescent period.

22. The communications device as described in claim 15 wherein said determining said first estimated frequency error comprises:
sampling frequency data a plurality of times during a quiescent period; and
applying a median filter to said frequency data.

23. The communications device as described in claim 15 wherein said second given threshold comprises a frequency value.

24. A communications device as described in claim 15 wherein said second given threshold comprises a pre-determined percent of said first estimated frequency error.

25. The communication device as described in claim 15 further comprising:
a display for displaying information.

26. The communication device as described in claim 25 further comprising:
a user-interface operable to allow a user to input data to said communications device.

27. The communication device as described in claim 26 further comprising:
a memory operable to store information.

28. A method of performing frequency correction, said method comprising:
determining a first estimated frequency error;
applying a first frequency correction based on said first estimated frequency error;
performing a large frequency correction when said first estimated frequency error is larger than a given threshold, wherein said performing comprises:
determining a second estimated frequency error; and
applying a second frequency correction based on said second estimated error when said second estimated frequency error is within a second given threshold; and
restoring an original frequency when said second frequency error is outside of said second given threshold.

29. A method of performing a frequency correction, said method comprising:
determining a first estimated frequency error;
applying a first frequency correction based on said first estimated frequency error;
performing a large frequency correction when said first estimated frequency error is larger than a given threshold, wherein said performing comprises:
determining a second estimated frequency error; and
applying a second frequency correction based on said second estimated error when said second estimated frequency error is within a second given threshold;
after said applying said second frequency correction, determining whether received data is valid;
updating a reference frequency based on said first and said second estimated frequency errors when said received data is valid; and
restoring an original reference frequency when said received data is invalid.

30. A method of performing a frequency correction, said method comprising:
determining a first estimated frequency error;
applying a first frequency correction based on said first estimated frequency error; and
performing a large frequency correction when said first estimated frequency error is larger than a given threshold, wherein said performing comprises:
determining a second estimated frequency error; and
applying a second frequency correction based on said second estimated error when said second estimated frequency error is within a second given threshold, wherein said second given threshold is selected from a group consisting of a frequency value and a predetermined percentage of said first estimated frequency error.

31. A communications device comprising:
a tunable module operable to use a reference frequency; and
logic operable to:
determine a first estimated frequency error;
apply a first frequency correction based on said first estimated frequency error;
perform a large frequency correction when said first estimated frequency error is larger than a given threshold;
determine a second estimated frequency error;
apply a second frequency correction based on said second estimated error when said second estimated frequency error is within a second given threshold;
after said applying said second frequency correction, determine whether received data is valid;
update a reference frequency based on said first and said second estimated frequency errors when said received data is valid; and
restore an original reference frequency when said received data is invalid.

32. A communications device comprising:
a tunable module operable to use a reference frequency; and
logic operable to:
determine a first estimated frequency error;

apply a first frequency correction based on said first estimated frequency error;
perform a large frequency correction when said first estimated frequency error is larger than a given threshold;
determine a second estimated frequency error; and
apply a second frequency correction based on said second estimated error when said second estimated frequency error is within a second given threshold, wherein said second given threshold is selected from a group consisting of a frequency value and a predetermined percentage of said first estimated frequency error.

33. A communications device comprising:
a tunable module operable to use a reference frequency; and
logic operable to:
determine a first estimated frequency error;
apply a first frequency correction based on said first estimated frequency error;
perform a large frequency correction when said first estimated frequency error is larger than a given threshold; and
update a net total of frequency errors from last net total update in response to said first estimated frequency error being less than or equal to said first given threshold.

34. A communications device comprising:
a tunable module operable to use a reference frequency; and
logic operable to:
determine a first estimated frequency error;
apply a first frequency correction based on said first estimated frequency error;
perform a large frequency correction when said first estimated frequency error is larger than a given threshold;
determine a second estimated frequency error; and
apply a second frequency correction based on said second estimated error when said second estimated frequency error is within a second given threshold, wherein said second given threshold comprises a predetermined percentage of said first estimated frequency error.

35. A computing device comprising:
a processor;
a memory;
a tunable module operable to use a reference frequency; and
logic operable to:
determine a first estimated frequency error;
apply a first frequency correction based on said first estimated frequency error;
perform a large frequency correction when said first estimated frequency error is larger than a given threshold; and
update a net total of frequency errors from a last net total update in response to said first estimated frequency error being less than or equal to said first given threshold.

36. The computing device as described in claim 35, wherein said logic is further operable to:
determine a second estimated frequency error; and
apply a second frequency correction based on said second estimated error when said second estimated frequency error is within a second given threshold.

37. The computing device as described in claim 36, wherein said logic is further operable to:
restore an original frequency when said second frequency error is outside of said second given threshold.

38. The computing device as described in claim 36, wherein said logic is further operable to:
after said applying said second frequency correction, determine whether received data is valid;
update a reference frequency based on said first and said second estimated frequency errors when said received data is valid; and
restore an original reference frequency when said received data is invalid.

39. The computing device as described in claim 36, wherein said second given threshold is selected from a group consisting of a frequency value and a predetermined percentage of said first estimated frequency error.

40. The computing device as described in claim 36, wherein said second given threshold comprises a frequency value.

41. A computing device as described in claim 36, wherein said second given threshold comprises a pre-determined percent of said first estimated frequency error.

42. The computing device as described in claim 35, wherein said logic is further operable to:
store a new reference frequency based on said net total and a previously stored reference frequency when said net total is greater than a third pre-determined amount.

43. The computing device as described in claim 35, wherein said determining a first estimated frequency error comprises:
sampling frequency received data to provide sample data; and
applying a median filter to said sampled data.

44. The computing device as described in claim 43, wherein said sampling is performed during a quiescent period.

45. The computing device as described in claim 35, wherein said determining said first estimated frequency error comprises:
sampling frequency data a plurality of times during a quiescent period; and
applying a filter to said frequency data.

46. The computing device as described in claim 35 further comprising:
a display for displaying information.

47. The computing device as described in claim 35 further comprising:
a user-interface operable to allow a user to input data.

* * * * *